United States Patent
Sautto et al.

(10) Patent No.: US 9,853,617 B2
(45) Date of Patent: Dec. 26, 2017

(54) PROGRAMMABLE-GAIN AMPLIFIER, CORRESPONDING DEVICE AND METHOD

(71) Applicant: STMicroelectronics S.R.L., Agrate Brianza (IT)

(72) Inventors: Marco Sautto, Vittuone (IT); Fabio Quaglia, Pizzale (IT); Giulio Ricotti, Broni (IT); Andrea Mazzanti, Modena (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 15/168,832

(22) Filed: May 31, 2016

(65) Prior Publication Data

US 2017/0179897 A1 Jun. 22, 2017

(30) Foreign Application Priority Data

Dec. 21, 2015 (IT) .......................... 102015000085908

(51) Int. Cl.
 *H03F 1/02* (2006.01)
 *H03G 1/00* (2006.01)
 (Continued)

(52) U.S. Cl.
 CPC ......... *H03G 1/0094* (2013.01); *H03F 3/2175* (2013.01); *H03F 3/45264* (2013.01);
 (Continued)

(58) Field of Classification Search
 CPC ............... H03F 1/02; H03F 3/45; H03F 3/005
 (Continued)

(56) References Cited

U.S. PATENT DOCUMENTS

| 6,486,711 B1 | 11/2002 | Tsay et al. |
| 6,750,727 B1 * | 6/2004 | Sutardja ............... H03B 5/1228 330/253 |

(Continued)

OTHER PUBLICATIONS

Choi et al., "Accurate dB-Linear Variable Gain Amplifier With Gain Error Compensation," *IEEE Journal of Solid-State Circuits* 48(2):456-464, Feb. 2013.

(Continued)

*Primary Examiner* — Steven J Mottola
(74) *Attorney, Agent, or Firm* — Seed IP Law Group LLP

(57) ABSTRACT

A programmable-gain amplifier includes: two complementary cross-coupled transistor pairs mutually coupled with each transistor in one pair having a current flow path cascaded with a current flow path of a respective one of the transistors in the other pair. First and second coupling points are formed between the pairs; with first and second sampling capacitors coupled thereto. First and second input stages have input terminals to input signals for sampling by the first and second sampling capacitors. Switching means couple the first and second input stages to the sampling capacitors so the input signals are sampled as sampled signals on the sampling capacitors. The switching means energizes the complementary cross-coupled transistor pairs so the signals sampled on the sampling capacitors undergo negative resistance regeneration growing exponentially over time to thereby provide an exponential amplifier gain.

19 Claims, 2 Drawing Sheets

(51) Int. Cl.
*H03F 3/45* (2006.01)
*H03F 3/217* (2006.01)

(52) U.S. Cl.
CPC ............... *H03F 2200/312* (2013.01); *H03F 2203/45288* (2013.01)

(58) Field of Classification Search
USPC ..................................... 330/9, 252, 253, 254
See application file for complete search history.

(56) References Cited

U.S. PATENT DOCUMENTS

| 7,276,962 | B1 | 10/2007 | Tomasi | |
|---|---|---|---|---|
| 2003/0227326 | A1* | 12/2003 | Amourah | H03F 3/45188 330/253 |

OTHER PUBLICATIONS

Duong et al., "A 95-dB Linear Low-Power Variable Gain Amplifier," *IEEE Transactions on Circuits and Systems—I: Regular Papers* 53(8):1648-1656, Aug. 2006.

Elwan et al., "A Differential-Ramp Based 65 dB-Linear VGA Technique in 65 nm CMOS," *IEEE Journal of Solid-State Circuits* 44(9):2503-2514, Sep. 2009.

Liu et al., "Cell-Based Variable-Gain Amplifiers With Accurate dB-Linear Characteristic in 0.18 μm CMOS Technology," *IEEE Journal of Solid-State Circuits* 50(2):586-596, Feb. 2015.

Onet et al., "Compact Variable Gain Amplifier for a Multistandard WLAN/WiMAX/LTE Receiver," *IEEE Transactions on Circuits and Systems—I: Regular Papers* 61(1):247-257, Jan. 2014.

Palá-Schönwälder et al., "Baseband Superregenerative Amplification," *IEEE Transactions on Circuits and Systems—I: Regular Papers* 56(9):1930-1937, Sep. 2009.

Razavi, "The Cross-Coupled Pair—Part I," *IEEE Solid-State Circuits Magazine* 6(3):7-10, Summer 2014.

Sautto et al., "A 420μW 100GHz-GBW CMOS Programmable-Gain Amplifier Leveraging the Cross-Coupled Pair Regeneration," 2016 IEEE International Solid-State Circuits Conference, Session 5, Analog Techniques, 5.6, 2016, pp. 18-20.

Yamaji et al., "A Temperature-Stable CMOS Variable-Gain Amplifier With 80-dB Linearly Controlled Gain Range," *IEEE Journal of Solid-State Circuits* 37(5):553-558, May 2002.

Abidi et al., "Understanding the Regenerative Comparator Circuit," IEEE Proceedings of the Custom Integrated Circuits Conference (CICC), Sep. 15-17, 2014, 8 pages.

* cited by examiner

PROGRAMMABLE-GAIN AMPLIFIER, CORRESPONDING DEVICE AND METHOD

BACKGROUND

Technical Field

The description relates to programmable-gain amplifiers (PGA's).

Possible applications of one or more embodiments may include ultrasound (e.g., a portable ultrasound probes), medical imaging, hard disks (e.g., read channel), wireless communications and others.

Description of the Related Art

Variable gain amplifiers may be used in gain control loops.

Desired features of these amplifiers may include, e.g.:

a wide range of gain variation, with maximum gains of, e.g., 50-60 dB and/or a constant bandwidth, possibly in excess of 20 MHz, which means gain-bandwidth products in the order of tens of GHz;

low power consumption;

a gain control linear in a dB scale.

Meeting these specifications with technical standards may not be easy; despite the extensive activity in that area, a demand is still felt for improved programmable-gain amplifier arrangements.

BRIEF SUMMARY

According to one or more embodiments, a programmable-gain amplifier has the features set forth in the claims that follow.

One or more embodiments may also relate to a corresponding system (e.g., an ultrasound device such as a portable ultrasound probe, a medical imaging system, a hard disk drive, wireless communications apparatus) and a corresponding method.

The claims are an integral part of the disclosure of the one or more exemplary embodiments as provided herein.

One or more embodiments may provide a linear regenerative amplifier.

One or more embodiments may include a negative resistor including two cross-coupled pairs with a differential arrangement and a preamplifier stage.

One or more embodiments may offer one or more of the following advantages:

high gain (optionally in a single stage, which facilitates achieving linearity), wide bandwidth, low power consumption, and a "natural" dB-linear gain control achieved by changing linearly (and precisely) the regeneration time.

BRIEF DESCRIPTION OF THE SEVERAL VIEWS OF THE DRAWINGS

One or more embodiments will now be described, by way of example only, with reference to the annexed figures, wherein.

DETAILED DESCRIPTION

Figure 1:
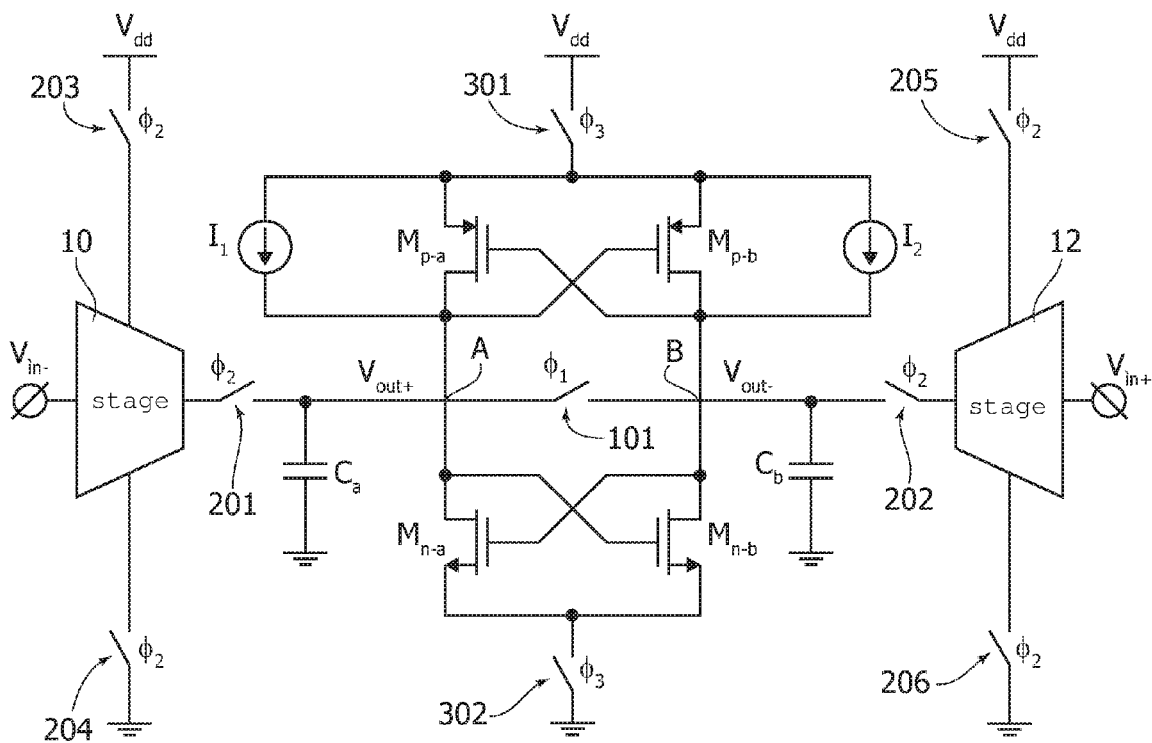
FIG. 1 is a schematic block diagram exemplary of one or more embodiments.

In the ensuing description, one or more specific details are illustrated, aimed at providing an in-depth understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

For the sake of brevity, certain documents will be referred to in the following description by means of reference numerals between parentheses (e.g., [X]), with the numeral indicating the document in the list of documents which appears at the end of this description.

As indicated, a desirable feature of programmable-gain amplifiers is dB-linear gain control.

A travelling wave, e.g., a pressure wave which propagates within the human body or an electromagnetic wave may be subjected to exponential attenuation. An exponential gain, which changes linearly in dB as a function of a linear control, is thus a desirable feature in an amplifier intended to process a corresponding signal in order to properly compensate that attenuation. A dB-linear control involves implementing an exponential function, which may be difficult to achieve with MOS technologies.

Programmable-gain amplifiers may admit a variety of implementations.

Some of these (see e.g., G.-H. Duong, et al.: "A 95-dB linear low-power variable gain amplifier", *IEEE Trans. Circuits Syst. I, Reg. Papers*, vol. 53, no. 8, pp. 1648-1657, August 2006) may be based on an approximation of the exponential function (e.g., a pseudo-exponential approximation), which may lead to limited bandwidths at high gains and a high power consumption. Also, the approximation has a limited operating range.

Other implementations (see e.g., T. Yamaji, et al.: "A temperature-stable CMOS variable-gain amplifier with 80-dB linearly controlled gain range", *IEEE J. Solid-State Circuits*, vol. 37, no. 5, pp. 553-558, May 2002) may involve current "steering". In that case, given the MOS quadratic characteristic, the need exists for a separate block to generate an exponential function.

Another possibility (see e.g., H. Elwan, et al.: "A differential-ramp based 65-dB linear VGA technique in 65 nm CMOS", *IEEE J. Solid-State Circuits*, vol. 44, no. 9, pp. 2503-2514, September 2009) involves an opamp in a feedback loop. In that case, a large area occupation may arise and a complex ramp generator may be needed in order to achieve a continuous gain range.

An open-loop architecture using a multi-stage approach is disclosed in H. Liu et al., "Cell-Based Variable-Gain Amplifiers With Accurate dB-Linear Characteristic in 0.18 μm CMOS Technology," *IEEE J. Solid-State Circuits*, vol. 50, no. 2, pp. 586-596, February 2015. In such a multi-stage arrangement, a cascade of amplifiers can increase the GBW, with the disadvantage of a higher power consumption and linearity being penalized. Also, accurate trimming of each single cell may be required in order to achieve a good accuracy in gain control due to additive errors.

Regenerative amplification is largely used in sense amplifiers, in regenerative comparators, e.g., to regenerate logic levels.

An underlying operating principle of regenerative amplification may be exemplified as follows.

For t<0 an input signal Vin is sampled on a capacitor C via a "sampling" switch. The sampling switch subsequently opens and the capacitor C is coupled via a "regeneration" switch with a negative resistance −R which regenerates the voltage across the capacitor. After a time t_reg, the voltage across the capacitor is Vin times a positive exponential $e^{(t\_reg/RC)}$.

This makes it possible to obtain an exponential gain, controlled linearly in dB by changing linearly the regeneration time t_reg.

It was observed that regenerative amplification may be used in linear amplification, e.g., as discrete-component implementation (that is non IC) implementation, of a single ended type based on an opamp in a closed positive feedback loop (see, e.g., P. P. Schonwalder et al., "Baseband Superregenerative Amplification," *IEEE Trans. Circuits and Systems—I*, vol. 56, no. 9, pp. 1930-1937, September 2009). This may result in very narrow bandwidths.

It was similarly observed that, out of the fundamental circuits of electronics, cross-coupled pairs (see, e.g., B. Razavi, "The Cross-Coupled Pair—Part I," *IEEE Solid-State Circuits Magazine*, vol. 6, no. 3, pp. 7-10, August 2014) are among those most widely adopted and still in use today. This device arrangement yields broadband positive feedback with high gain and low power, desirable features both in analog and digital applications. Its small signal properties are consistently leveraged in oscillators, impedance negators and to boost gain of transconductors, while the bistable behavior is exploited in static latches and memory cells. Traditionally, their regeneration capability is leveraged in the design of sense amplifiers and high-speed comparators.

One or more embodiments may thus rely on the performance of cross-coupled pairs in discrete-time linear amplification, with the regeneration feature facilitating the implementation of programmable-gain amplifiers (PGAs).

As indicated, a desired feature of PGAs is the ability to provide dB-linear gain control. This may involve implementing an exponential function, which may be a challenging task to achieve with the square-law and linear I-V characteristics of MOS devices. In addition, wide range of gain variation, large bandwidth, and rail-to-rail output swing with low power consumption are desirable features (see, e.g., H. Liu et al., "Cell-Based Variable-Gain Amplifiers With Accurate dB-Linear Characteristic in 0.18 μm CMOS Technology," *IEEE J. Solid-State Circuits*, vol. 50, no. 2, pp. 586-596, February 2015; I. Choi et al., "Accurate dB-Linear Variable Gain Amplifier With Gain Error Compensation," *IEEE J. Solid State Circuits*, vol. 48, no. 2, pp. 456-464, February 2013; R. Onet et al., "Compact variable gain amplifier for a multistandard WLAN/WiMAX/LTE receiver," *IEEE Trans. Circuits Syst. I, Reg. Papers*, vol. 61, no. 1, pp. 247-257, January 2014).

One or more embodiments may thus be based on the recognition that, by resorting to regenerative amplification, the exponential growth of the output voltage may enable a dB-linear gain control. At the same time, regeneration may greatly outperform the linear gain-bandwidth (GBW) trade-off of continuous-time amplifiers (see, e.g., P. P. Schonwalder et al., "Baseband Superregenerative Amplification," *IEEE Trans. Circuits and Systems—I*, vol. 56, no. 9, pp. 1930-1937, September 2009), yielding excellent driving capability at high frequency and with low power.

FIG. 1 is a schematic block diagram exemplary of one or more embodiments including two complementary cross-coupled transistor (e.g., MOS) pairs designated $M_{n-a}$, $M_{n-b}$ and $M_{p-a}$, $M_{p-b}$, respectively.

The two pairs may be mutually coupled is such a way that each transistor in one pair has its current flow path (namely, the current source-current sink path, e.g., the source-drain path in a FET) cascaded with the current flow path of a respective one of the transistors in the other pair.

For instance, in the exemplary arrangement of FIG. 1:

the transistor $M_{n-a}$ in the first pair has its current flow path cascaded with the current flow path of the transistor $M_{p-a}$ in the second pair;

the transistor $M_{n-b}$ in the first pair has its current flow path cascaded with the current flow path of the transistor $M_{p-b}$ in the second pair.

In one or more embodiments, sampling capacitors $C_a$, $C_b$ (e.g., with a same capacitance value) may be set between the coupling points A, B between the transistor pairs, e.g., the common points (here drains) of the cascaded current flow paths and ground.

In one or more embodiments the sampling capacitors $C_a$, $C_b$ may be driven by respective transconductor stages designated 10, 12, e.g., having a same transconductance value $g_{m,in}$.

The transconductor stages 10, 12 may have respective input terminals for receiving input (voltage) signals $V_{in-}$, $V_{in+}$ and output terminals to provide respective output signals to be sampled on the capacitors $C_a$, $C_b$.

In one or more embodiments, the transconductor stages 10, 12 may be implemented with CMOS inverters to provide respective output signals $V_{out+}$, $V_{out-}$ to be sampled on the capacitors $C_a$, $C_b$.

In one or more embodiments the circuit may be set between a supply voltage rail $V_{dd}$ and ground with operation clocked by switches (e.g., electronic switches, such as MOSFETs), including:

a (first) switch 101 clocked with a first phase φ1, the switch set between the points A and B;

a (second) set of switches 201, 202, 203, 204, 205, 206 clocked with a second phase φ2 and configured to i) couple the outputs of the transconductor stages 10, 12 to the respective sampling capacitor $C_a$, $C_b$, and ii) couple the transconductor stages 10, 12 between the supply voltage $V_{dd}$ and ground;

a (third) set of switches 301, 302 clocked with a third phase φ3 and configured to couple the two complementary cross-coupled transistor pairs $M_{n-a}$, $M_{n-b}$ and $M_{p-a}$, $M_{p-b}$ between the voltage $V_{dd}$ and ground.

It will be appreciated that, while not mandatory, coupling the transconductor stages 10, 12 between the supply voltage $V_{dd}$ and ground as the outputs of the transconductor stages 10, 12 are coupled to the respective sampling capacitors $C_a$, $C_b$ may facilitate reducing power consumption insofar as the transconductor stages 10, 12 will be energized (only) during signal sampling onto the capacitors $C_a$, $C_b$.

As exemplified herein, a certain switch/set of switches being clocked by a phase ϕi (i=1, 2, 3) means that the switch/es will be closed (that is turned "on", e.g., made conductive) when the signal representative of the phase is "high", and open (that is turned "off", e.g., made non-conductive) when the signal representative of the phase is "low". A possible time behavior of the three phases (ϕ1, ϕ2, ϕ3) is exemplified in portion b) of FIG. 2.

This corresponds to cyclical operation of the circuit with a period $T_{CK}$, including four subsequent reset, sampling, regeneration and hold intervals $T_{res}$, $T_{smp}$, $T_{reg}$, $T_{hld}$ according to the table below.

| Interval | Phase ϕ1 | Phase ϕ2 | Phase ϕ3 |
| --- | --- | --- | --- |
| Reset $T_{res}$ | high | low | High |
| Sampling $T_{smp}$ | low | high | Low |
| Regeneration $T_{reg}$ | low | low | High |
| Hold $T_{hld}$ | low | low | Low |

It will otherwise be appreciated that operation as exemplified in the following may be obtained with different arrangements of switches and phases which may be devised by those of skill in the art.

Whatever the specific details of embodiments, during the period $T_{CK}$, the differential output ($V_{out+} - V_{out-}$) may be first zeroed during reset $T_{res}$ by shorting the two capacitors $C_a$, $C_b$ via the switch 101 with the common-mode voltage set to about $V_{dd}/2$ by switching on the cross-coupled pairs with ϕ1 and ϕ3 simultaneously high, while ϕ2 is low.

During sampling (ϕ2 high, with ϕ1 and ϕ3 low) the input signal may be partially amplified and sampled on $C_a$, $C_b$. At the end of ϕ2, assuming a judicious short sampling time $T_{smp}$, the differential input voltage $V_{in}$ ($V_{in+} - V_{in-}$) is amplified approximately by $(g_{m,in}/C_{a,b}) \cdot T_{smp}$.

Regeneration may then take place during $T_{reg}$ by supplying the cross-coupled pairs $M_{n-a}$, $M_{n-b}$ and $M_{p-a}$, $M_{p-b}$ (ϕ3 high with ϕ1 and ϕ2 low). The pairs $M_{n-a}$, $M_{n-b}$ and $M_{p-a}$, $M_{p-b}$ may shunt $C_a$, $C_b$ with a negative resistance yielding a negative time constant $T_{reg} = -C_{a,b}/g_{m,xc}$ (with $g_{m-xc} = (g_{m,n} + g_{m,p})$) and an exponential growth of $V_{out}$.

After regeneration, namely $T_{reg}$, the circuit may enter a hold mode $T_{hld}$ (all of ϕ1, ϕ2 and ϕ3 low) with cross-coupled pairs switched off and the final value for $V_{out}$ is stored on $C_a$ and $C_b$.

The gain experienced by the sampled value of $V_{in}$ may be expressed as $$A_v = (g_{m,in}/C_{a,b}) \cdot T_{smp} \cdot e^{T_{reg}/|\tau_{reg}|}$$

that is with a first term, due to sampling, and a second term, due to regeneration, which exhibits an exponential dependence on $T_{reg}/|\tau_{reg}|$.

In one or more embodiments, dB-linear gain control may thus be achieved by changing $T_{reg}$ linearly.

Regeneration allows a high gain, yielding very high values for GBW.

For instance, with a clock frequency $f_{ck}$=100 MHz, signal bandwidth may be limited to 50 MHz by sampled-time operation.

In one or more embodiments, with, e.g., $g_{m,xc}$=2.5 mS and $C_a = C_b$=2 pF, $|\tau_{reg}|$=800 ps.

Assuming 0 dB gain in the sampling phase $T_{smp}$ and $T_{reg}$ limited to 0.5 $T_{CK}$ (to leave margin for the reset, sampling and hold phases) a gain of 54.3 dB may be achieved. The corresponding GBW is 25.9 GHz, about 130 times higher than the GBW of a continuous-time amplifier driving $C_a$, $C_b$ with the same $g_m$ of the cross-coupled pairs.

In one or more embodiments, in order to avoid saturation at high gains, static and dynamic offsets may be corrected via two current sources $I_1$ and $I_2$ (e.g., driven differentially by a charge pump in manner known per se) as shown in FIG. 1.

In one or more embodiments, amplifier noise performance may be dictated primarily by the input transconductors 10, 12 and the cross-coupled pairs $M_{n-a}$, $M_{n-b}$ and $M_{p-a}$, $M_{p-b}$.

Considering thermal noise, the equivalent input noise power $v^2_{n,in}$ was found to include a contribution from the cross-coupled pairs which is independent of $g_{m,n}$ and $g_{m,p}$. Moreover, a moderate gain in the sampling phase was found to be sufficient to make it negligible, leaving the input transconductors as the main noise source.

In one or more embodiments, increasing $T_{smp}$ was found to reduce $v^2_{n,in}$ with $T_{smp}$ also increasing the gain in the sampling phase.

A judicious choice may thus be dictated by a compromise between noise performance and gain compression of the input transconductors. Values such as $g_{m,in}$=3.5 mS (S=siemens) and $T_{smp}$=2.5 ns, providing 12.8 dB gain in the sampling phase and $v^2_{n,in}$=(54.3 μVrms)$^2$ were found to provide satisfactory operation.

Figure 2:
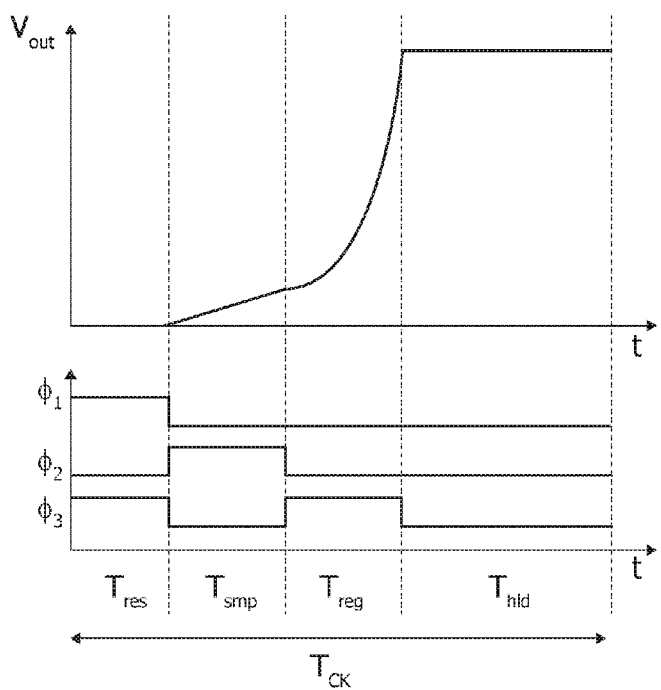
FIG. 2 includes a first upper portion exemplary of a possible time behavior of an output voltage in one or more embodiments plotted against the time behavior of certain timing signals as represented in a second lower portion of the figure.

In one or more embodiments, three cascaded pulse generators 14, 16, 18 may be driven by an external clock CK and having logical inverters 15 and 17 at the inputs of 16 and 18 may provide the amplifier control signals as depicted in FIG. 2. With such a cascaded connection, overlapping of the phases may be avoided.

In one or more embodiments, a linear variation of the time $T_{reg}$ may be obtained by varying the charging current of a capacity with a digital-to-analog (DAC) current.

Figure 3:
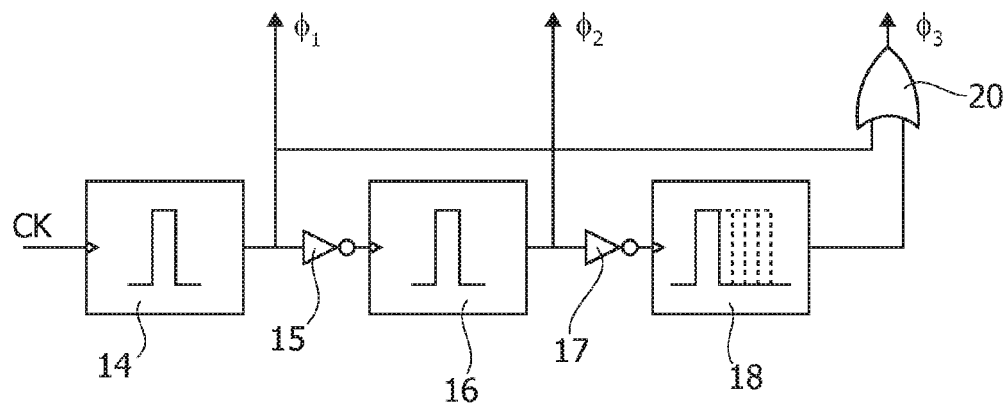
FIG. 3 is a schematic block diagram exemplary of timing generation one or more embodiments, and FIG. 4 in a block diagram further detailing the block diagram of FIG. 3.
Figure 4:
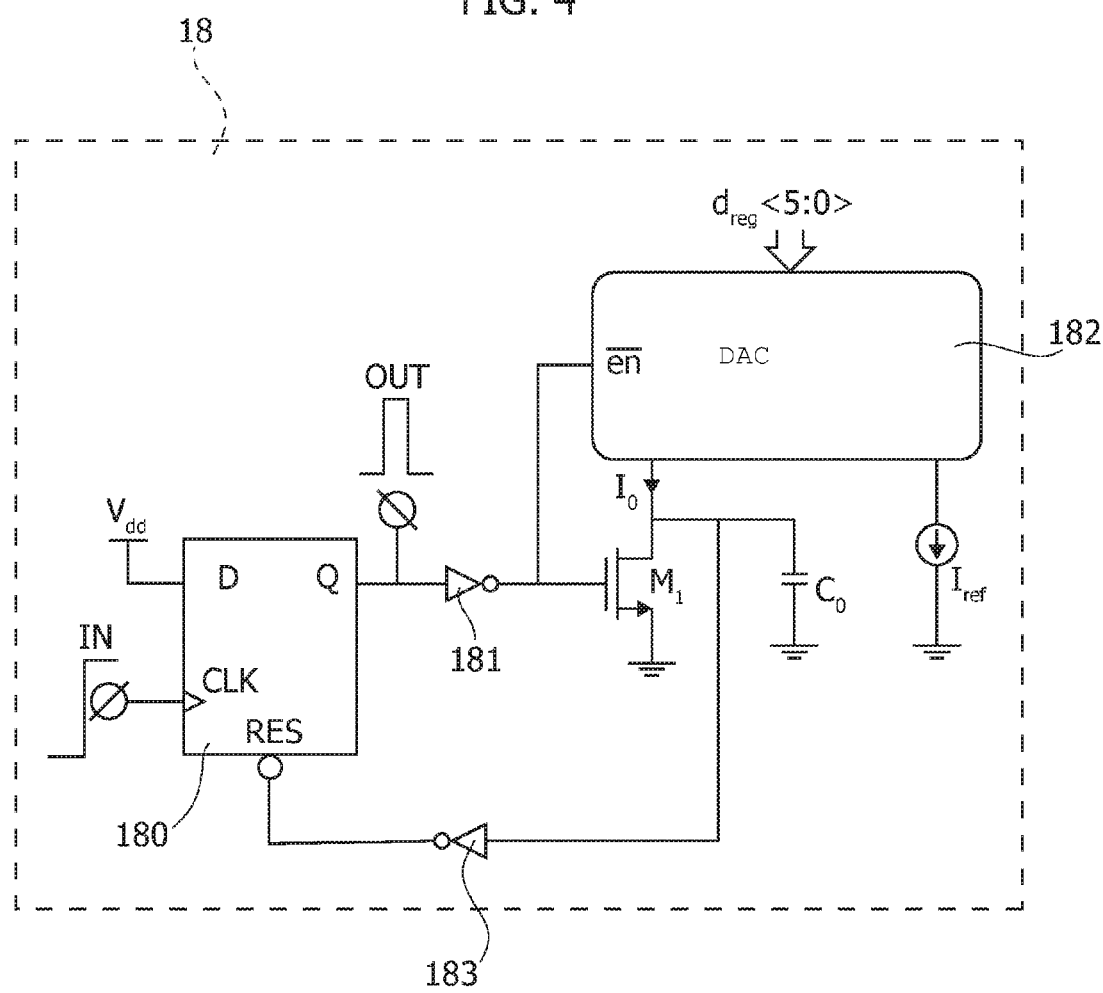

In one or more embodiments, $T_{reg}$ may be made programmable, e.g., by providing ϕ3 as the output of an OR gate 20 having as its inputs ϕ1 (taken at the output of the pulse generator 14) plus the output of a pulse generator 18 implemented as exemplified in FIG. 4. In the arrangement exemplified in FIG. 3, ϕ2 may be taken at the output of the pulse generator 16.

A pulse generator 18 as exemplified in FIG. 4 includes an input flip-flop 180 receiving the output from the inverter 17 as a CLK input IN (the D input being set to $V_{dd}$) while the output Q from the flip-flop 18 provides an output OUT to the gate 20.

The output Q from the flip-flop 18 may also be fed via an inverter 181 as a (negated) enable signal neg(en) to a digital-to-analog converter (I-DAC) 182. The DAC 182 may receive a regulation signal $d_{reg}$ (e.g., <5:0>) and provide, in addition to a reference current $I_{ref}$, an output current $I_0$ towards a transistor (e.g., MOSFET) $M_1$ whose control electrode (e.g., gate) may be coupled to the output from the inverter 180. A capacitor $C_0$ may be set between the coupling point (e.g., drain) of the transistor $M_1$ to the DAC 182 and ground. The coupling point of the transistor $M_1$ to the DAC 182 may also be referred via an inverter 183 to the reset input of the FF 180.

Operation of the arrangement of FIG. 4 may be described as follows.

The output OUT is usually low with the capacitor $C_0$ shorted to ground by M1. A rising edge on the CLK input of the flip-flop 180 triggers an output pulse, e.g., with the output Q of the flip-flop 180 going high enabling $C_0$ to be charged via the current $I_0$. When the voltage across $C_0$ reaches the logic threshold of the inverter 183, the flip-flop 180 is reset and its output Q goes low. $I_0$ may be set with a, e.g., 6 bit resolution via the DAC 182, allowing a linear control on the output pulse duration.

In one or more embodiments, timing jitter in the control signals may limit the amplifier signal-to-noise ratio (SNR), this being primarily the case for the sampling and regeneration phases, that is φ1 and φ3. The corresponding SNR may be expressed as a function of $\sigma_{smp}$ and $\sigma_{reg}$, namely representing the rms jitter on $T_{smp}$ and $T_{reg}$.

In one or more embodiments, the pulse generators of FIGS. 3 and 4 may be designed to achieve, e.g., 8 ps maximum jitter, leading to $SNR_{smp}$ being about 50 dB and $SNR_{reg}$ about 40 dB.

One or more embodiments as exemplified herein may be suitable for implementation, e.g., in a 0.18 μm CMOS technology.

Measurements performed with the Applicants have demonstrated dB-linear amplification from 15 dB to 66 dB over a 50 MHz bandwidth with about 0.6 dB maximum gain error. When driving 2 pF load capacitors, one or more embodiments as exemplified herein may achieve a GBW up to 100 GHz with only 420 μW power consumption.

In testing performed with the Applicants (e.g., with the PGA operated at two gain settings of 20 dB and 60 dB and two different clock frequencies of 10 MHz and 100 MHz) core power dissipation, including control signal generation, was found to rise almost linearly with the clock frequency with a value of 420 μW with $V_{dd}$=1.8V at 100 MHz.

By changing the control code $d_{reg}$ of the DAC 180 in determining $T_{reg}$, gain ranges from 15 dB to 66 dB with +/−0.6 dB maximum deviation from an ideal dB-linear curve were obtained. The frequency response was found to be almost flat (less than 3 dB variation) up to 50 MHz, independently of the gain setting. An equivalent input noise power of $(76\ \mu V_{rms})^2$ was estimated from measurements, corresponding to a power spectral density spread over a 50 MHz bandwidth of 10.7 $nV/(Hz)^{1/2}$.

Distortion tests in terms of input-output curve and THD at 45 dB gain were performed, with an output 1 dB gain-compression point, OP1 dB, of −2 dBV (8 dBm on a 50Ω load). THD at OP1 dB was found to be −32 dB and better than −40 dB from 10 dB back-off down. IM3 tests with two tones of −14.7 dBV separated by 100 kHz indicated a IM3 at 38.1 dB below the main tones, corresponding to an equivalent OIP3 of 4.3 dBV (14.3 dBm).

Noise and distortion were thus found to be comparable or better than other amplifier arrangements featuring similar bandwidth and dB-linear gain control. For instance the arrangement of I. Choi et al., "Accurate dB-Linear Variable Gain Amplifier With Gain Error Compensation," *IEEE J. Solid State Circuits*, vol. 48, no. 2, pp. 456-464, February 2013, in 65 nm CMOS, shows lower noise with a bandwidth limited to 14.8 MHz and power dissipation which is five times higher.

One or more PGA embodiments as exemplified herein were thus found to be able to drive directly large load capacitors while demonstrating a GBW of 100 GHz with only 420 μW power dissipation.

The presence of a regeneration circuit in one or more embodiments may be detected, e.g., by observing the trend of signals over time, showing an evident difference between the output of a linear amplifier and that of a regenerative amplifier.

One or more embodiments may thus provide a programmable-gain amplifier, including:

two complementary cross-coupled transistor (e.g., MOS) pairs (see, e.g., $M_{n\text{-}a}$, $M_{n\text{-}b}$; $M_{p\text{-}a}$, $M_{p\text{-}b}$) mutually coupled with each transistor in one pair having a current flow path cascaded with a current flow path of a respective one of the transistors in the other pair to provide first and second coupling points (e.g., A, B) between said complementary cross-coupled transistor pairs;

first and second sampling capacitors (e.g., $C_a$, $C_b$) set between said first and second coupling points, respectively, and ground;

first and second input (e.g., 10, 12) stages having input terminals for receiving input signals (e.g., $V_{in-}$, $V_{in+}$) for sampling by said first and second sampling capacitors;

switching means (e.g., 201 to 206; 301, 302) selectively activatable:
  i) to couple said first and second input stages to said first and second sampling capacitors, whereby said input signals are sampled as sampled signals (e.g., $V_{out+}$, $V_{out-}$) on said first and second sampling capacitors, and
  ii) to energize said complementary cross-coupled transistor pairs whereby said sampled signals on said first and second sampling capacitors undergo negative resistance regeneration growing exponentially over time, thereby providing an exponential amplifier gain.

One or more embodiments may include further switch means (e.g., 101) set between said first and second sampling capacitors, said further switch means activatable to short-circuit said first and second sampling capacitors for amplifier reset (e.g., $T_{res}$).

In one or more embodiments said first and second input stages may include transconductor stages, optionally of the inverter type, e.g., CMOS transconductor stages.

One or more embodiments may include a timing circuit (e.g., 14 to 18, 20) for activating (see, e.g., phase φ3) said switching means (e.g. 301, 302) to energize said complementary cross-coupled transistor pairs over a controlled time span (e.g., $T_{reg}$) during said negative resistance regeneration thereby controlling said exponential amplifier gain.

In one or more embodiments said timing circuit may include:
  a digital-to-analog converter (e.g., 182) having an input for receiving a digital signal ($d_{reg}$) representative of said controlled time span and generating a charge current (e.g., $I_0$) as a function of said digital signal,
  a timing capacitor (e.g., $C_0$) charged with said charge current,
  a logic circuit (e.g., the flip-flop 180) configured for activating (φ3) said switching means to energize complementary cross-coupled transistor pairs when the charge on said timing capacitor reaches a charge threshold.

One or more embodiments may provide an electronic device including a programmable-gain amplifier as discussed previously. An ultrasound device such as a portable ultrasound probe, a medical imaging system, a hard disk drive, wireless communications apparatus may be exemplary of such a device.

In one or more embodiments a programmable-gain amplifier as discussed previously may be operated by activating said switching means:
  during a sampling interval (e.g., $T_{smp}$) to couple said first and second input stages to said first and second sampling capacitors, whereby said input signals are sampled as sampled signals on said first and second sampling capacitors,
  during a regeneration interval (e.g., $T_{reg}$) following said sampling interval to energize said complementary cross-coupled transistor pairs whereby said sampled signals on said first and second sampling capacitors undergo negative resistance regeneration growing exponentially over time, thereby providing an exponential amplifier gain.

One or more embodiments may include varying the duration of said regeneration interval thereby varying said exponential amplifier gain.

One or more embodiments may include at least one of:

de-energizing said complementary cross-coupled transistor pairs after said regeneration interval whereby said sampled signals grown exponentially over time due to negative resistance regeneration are held ($T_{hld}$) on said first and second sampling capacitors; and/or short-circuiting said first and second sampling capacitors during an amplifier reset interval (e.g., $T_{res}$).

Without prejudice to the underlying principles, the details and embodiments may vary, even significantly, with respect to what has been disclosed by way of example only, without departing from the extent of protection.

The extent of protection is defined by the annexed claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A programmable-gain amplifier, including:
two complementary cross-coupled transistor pairs mutually coupled with each transistor in one pair having a current flow path cascaded with a current flow path of a respective one of the transistors in the other pair to provide first and second coupling points between said complementary cross-coupled transistor pairs;
first and second sampling capacitors set between said first and second coupling points, respectively, and ground;
first and second input stages having input terminals for receiving input signals for sampling by said first and second sampling capacitors;
switching means selectively activatable:
to couple said first and second input stages to said first and second sampling capacitors, wherein said input signals are sampled as sampled signals on said first and second sampling capacitors, and
to energize said complementary cross-coupled transistor pairs so said sampled signals on said first and second sampling capacitors undergo negative resistance regeneration growing exponentially over time, thereby providing an exponential amplifier gain.

2. The programmable-gain amplifier of claim 1, including further switch means set between said first and second sampling capacitors, said further switch means activatable to short-circuit said first and second sampling capacitors for rest of the programmable gain amplifier.

3. The programmable-gain amplifier of claim 2, wherein said first and second input stages include transconductor stages.

4. The programmable-gain amplifier of claim 3, wherein said first and second input stages include CMOS transconductor stages.

5. The programmable-gain amplifier of claim 4 further including a timing circuit for activating said switching means to energize said complementary cross-coupled transistor pairs over a controlled time span during said negative resistance regeneration thereby controlling said exponential amplifier gain.

6. The programmable-gain amplifier of claim 5 wherein said timing circuit includes:
a digital-to-analog converter having an input for receiving a digital signal representative of said controlled time span and generating a charge current as a function of said digital signal,
a timing capacitor charged with said charge current,
a logic circuit configured for activating said switching means to energize said complementary cross-coupled transistor pairs when the charge on said timing capacitor reaches a charge threshold.

7. An electronic device, comprising:
a programmable-gain amplifier including;
two pairs of complementary cross-coupled transistors, each transistor in one pair having a series current flow path with one of the transistors in the other pair, first and second coupling nodes being formed at interconnections between the pairs and the two pairs being coupled between a supply voltage node and a reference voltage node;
first and second sampling capacitors coupled to the first and second coupling nodes, respectively;
first and second input circuits having inputs configured to receive first and second input signals, respectively, and having first and second outputs, respectively;
a switching circuit configured to couple during a sampling interval the first and second outputs of the input circuits to the first and second coupling nodes to charge the first and second capacitors and thereby sample the first and second input signals, and the switching circuit further configured to provide during a regeneration interval a supply voltage on the supply node and a reference voltage on the reference to generate a voltage across the first and second coupling nodes that exponentially increases over the regeneration;
electronic circuitry coupled to first and second coupling nodes of the programmable-gain amplifier.

8. The programmable-gain amplifier of claim 7, wherein the switching circuit is further configured, during a reset interval, to couple the first coupling node to the second coupling node and to isolate the supply voltage and reference voltage nodes from the supply and reference voltages, respectively, and to also isolate the first and second outputs of the input circuits from the coupling nodes.

9. The programmable-gain amplifier of claim 8, wherein the two pairs of complementary cross-coupled transistors comprises:
a pair of cross-coupled PMOS transistors coupled between the supply voltage node and the first and second coupling nodes; and
a pair of cross-coupled NMOS transistors coupled between the first and second coupling nodes and the reference voltage node.

10. The programmable-gain amplifier of claim 9, wherein each of the first and second input circuits comprises a transconductance amplifier.

11. The programmable-gain amplifier of claim 10, wherein each transconductance amplifier comprises a CMOS inverter.

12. The programmable-gain amplifier of claim 11 further comprising a timing circuit that generates a plurality of control signals, the switching circuit operable in the sampling interval, regeneration interval, and reset interval responsive to the plurality of control signals.

13. The programmable-gain amplifier of claim 12, wherein the timing circuit is configured to vary the duration of the regeneration interval to thereby control an exponential gain of the programmable-gain amplifier.

14. The programmable-gain amplifier of claim 13, wherein the timing circuit comprises a digital-to-analog converter configured to receive a digital input that determines the duration of the regeneration interval.

15. The programmable-gain amplifier of claim 7, wherein the electronic circuitry comprises one of ultrasound circuitry, medical imaging circuitry, hard disk circuitry, and wireless communications circuitry.

16. A method, comprising:
storing values of input signals on first and second coupling nodes during a sampling, interval,
exponentially amplifying a voltage across the first and second coupling nodes during a regeneration interval after the sampling interval, the exponentially amplifying including energizing two complementary cross-coupled transistor pairs coupled to the first and second coupling nodes; and
selectively varying the duration of the regeneration interval to thereby vary an exponential gain of the exponential amplifying.

17. The method of claim 16, wherein selectively varying comprises:
charging a capacitor with a current having a value based on a regulation value; and
terminating the regeneration interval responsive to a voltage across the capacitor.

18. The method of claim 16 further comprising equilibrating voltages on the first and second coupling nodes during a reset interval that occurs prior to the sampling interval.

19. The method of claim 16 further comprising at least one of:
de-energizing the two complementary cross-coupled transistor pairs after the regeneration interval; and
storing on the first and second coupling nodes upon de-energizing after the regeneration interval exponential output signals corresponding to the values of the input signals on the coupling nodes after the sampling interval grown exponentially over the time of the regeneration interval.

\* \* \* \* \*